(12) United States Patent
Landau et al.

(10) Patent No.: US 7,955,954 B2
(45) Date of Patent: Jun. 7, 2011

(54) METHOD OF MAKING SEMICONDUCTOR DEVICES EMPLOYING FIRST AND SECOND CARRIERS

(75) Inventors: Stefan Landau, Wehrheim (DE); Joachim Mahler, Regensburg (DE); Thomas Wowra, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 205 days.

(21) Appl. No.: 12/102,175

(22) Filed: Apr. 14, 2008

(65) Prior Publication Data

US 2009/0256247 A1 Oct. 15, 2009

(51) Int. Cl.
*H01L 21/301* (2006.01)
(52) U.S. Cl. ........ 438/464; 438/108; 438/109; 438/612; 438/613
(58) Field of Classification Search .......... 257/685–686, 257/737–738, 777–778; 438/108–109, 612–613, 438/464
See application file for complete search history.

(56) References Cited

U.S. PATENT DOCUMENTS

| 6,229,205 | B1 | 5/2001 | Jeong et al. | |
|---|---|---|---|---|
| 6,879,047 | B1* | 4/2005 | Heo | 257/777 |
| 2001/0007780 | A1 | 7/2001 | Minamio et al. | |
| 2004/0124527 | A1* | 7/2004 | Chiu | 257/723 |
| 2004/0164396 | A1* | 8/2004 | Hashimoto | 257/690 |
| 2004/0238206 | A1* | 12/2004 | Reid et al. | 174/254 |
| 2006/0033217 | A1* | 2/2006 | Taggart et al. | 257/778 |
| 2006/0278962 | A1* | 12/2006 | Gibson | 257/668 |
| 2007/0132091 | A1 | 6/2007 | Wu et al. | |
| 2008/0148559 | A1* | 6/2008 | Nickerson et al. | 29/832 |

FOREIGN PATENT DOCUMENTS

| CN | 1103617 A | 6/1995 |
|---|---|---|
| CN | 101246768 A | 8/2008 |
| EP | 0581298 B1 | 10/1998 |

OTHER PUBLICATIONS

The First Office Action for Chinese Patent Application No. 200910134172.7 issued Apr. 23, 2010 (9 pages).

* cited by examiner

*Primary Examiner* — Dung A. Le
(74) *Attorney, Agent, or Firm* — Dicke, Billig & Czaja, PLLC

(57) ABSTRACT

A semiconductor device and method. One embodiment provides an integral array of first carriers and an integral array of second carries connected to the integral array of first carriers. First semiconductor chips are arranged on the integral array of first carriers. The integral array of second carriers is arranged over the first semiconductor chips.

24 Claims, 14 Drawing Sheets

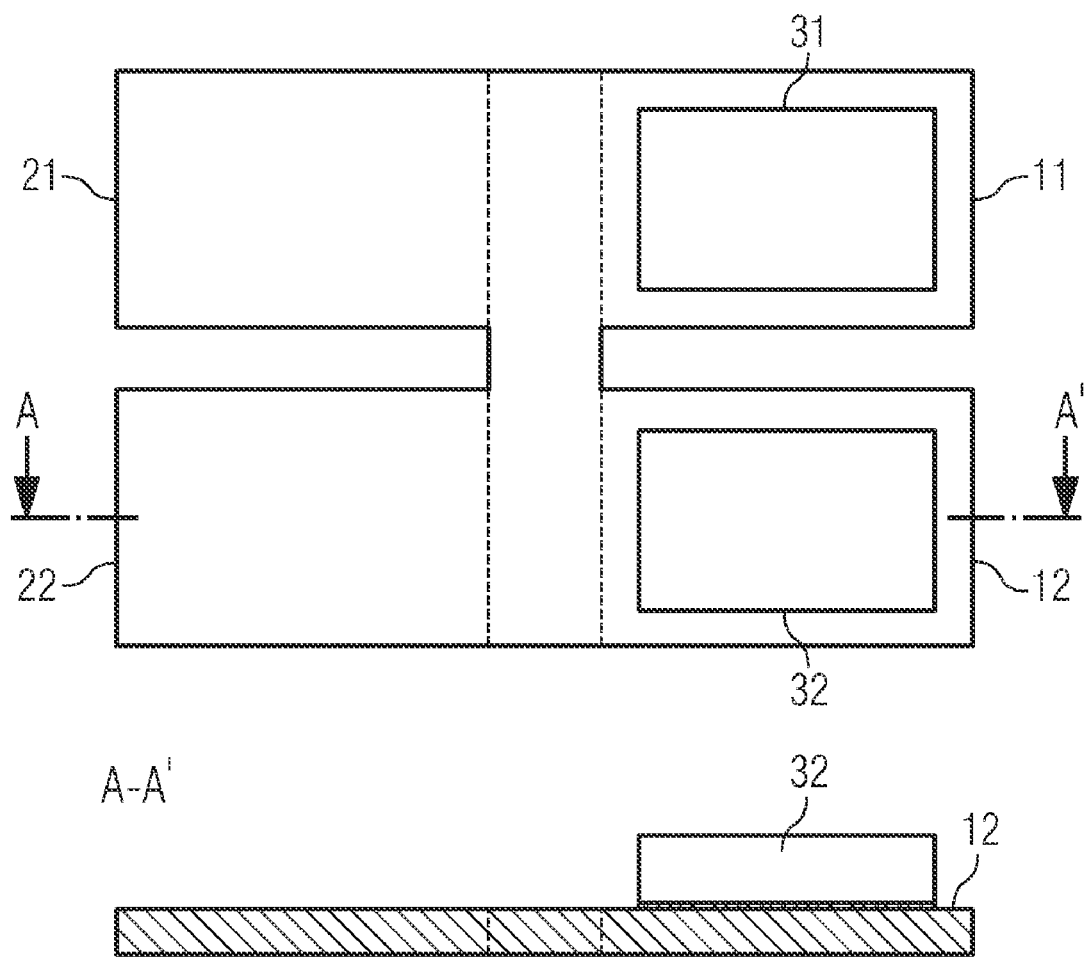

A-A'

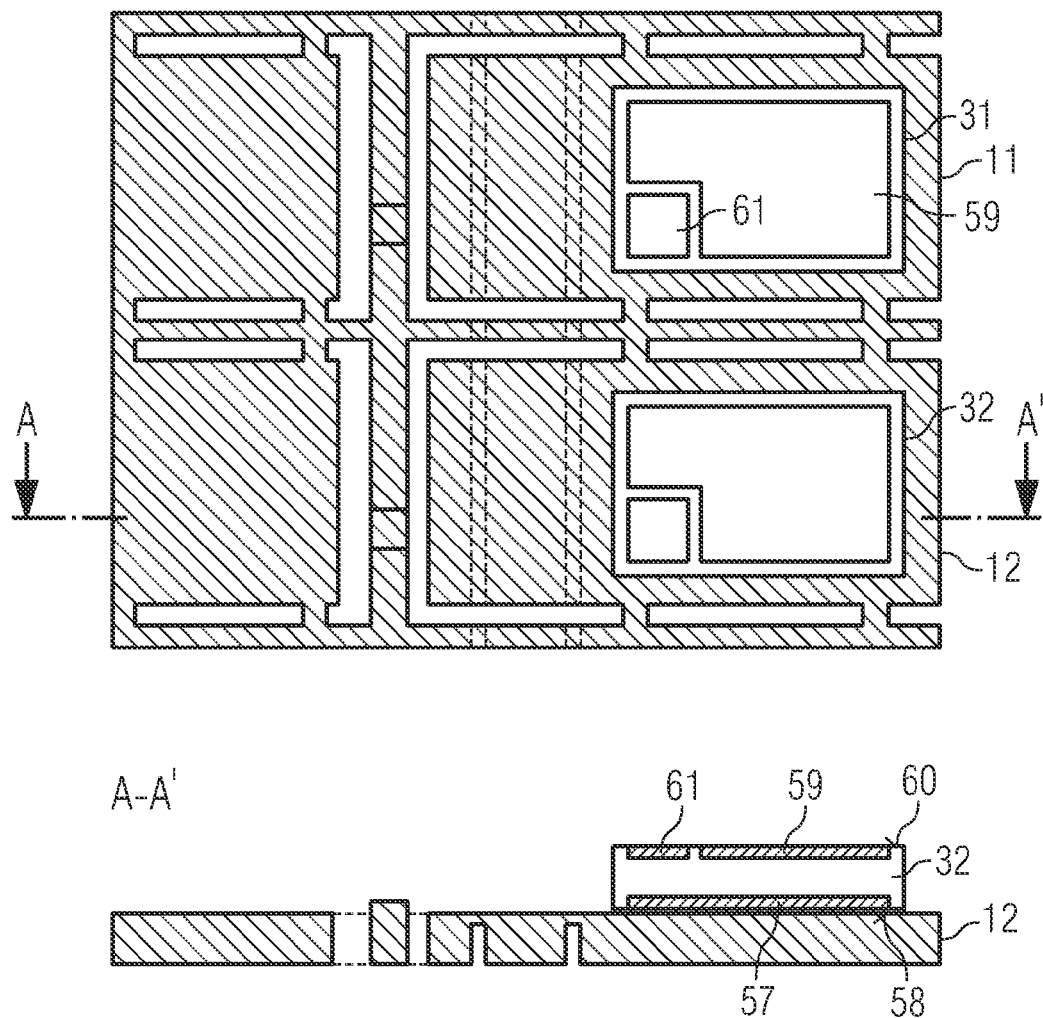

A-A'

A-A'

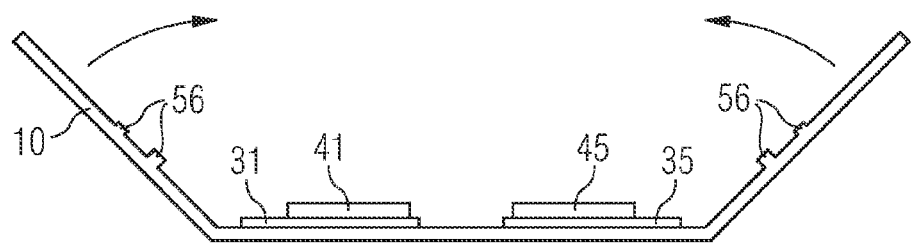
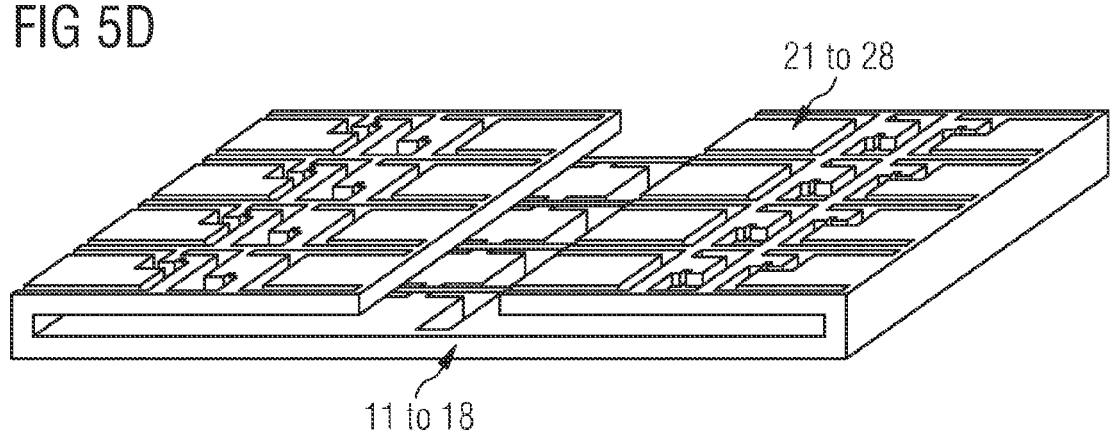

METHOD OF MAKING SEMICONDUCTOR DEVICES EMPLOYING FIRST AND SECOND CARRIERS

BACKGROUND

This invention relates to an electronic device and a method of fabricating thereof.

Power semiconductor chips may, for example, be integrated into electronic devices. Power semiconductor chips are suitable, in particular, for the switching or control of currents and/or voltages. Power semiconductor chips may, for example, be implemented as power MOSFETs, IGBTs, JFETs, power bipolar transistors or power diodes.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1C schematically illustrate one embodiment of a method to fabricate a device 100.

FIGS. 2A to 2E schematically illustrate one embodiment of a method to fabricate a device 200.

FIGS. 5A to 5G schematically illustrate one embodiment of a method to fabricate a device 500.

DETAILED DESCRIPTION

Figure 1A:
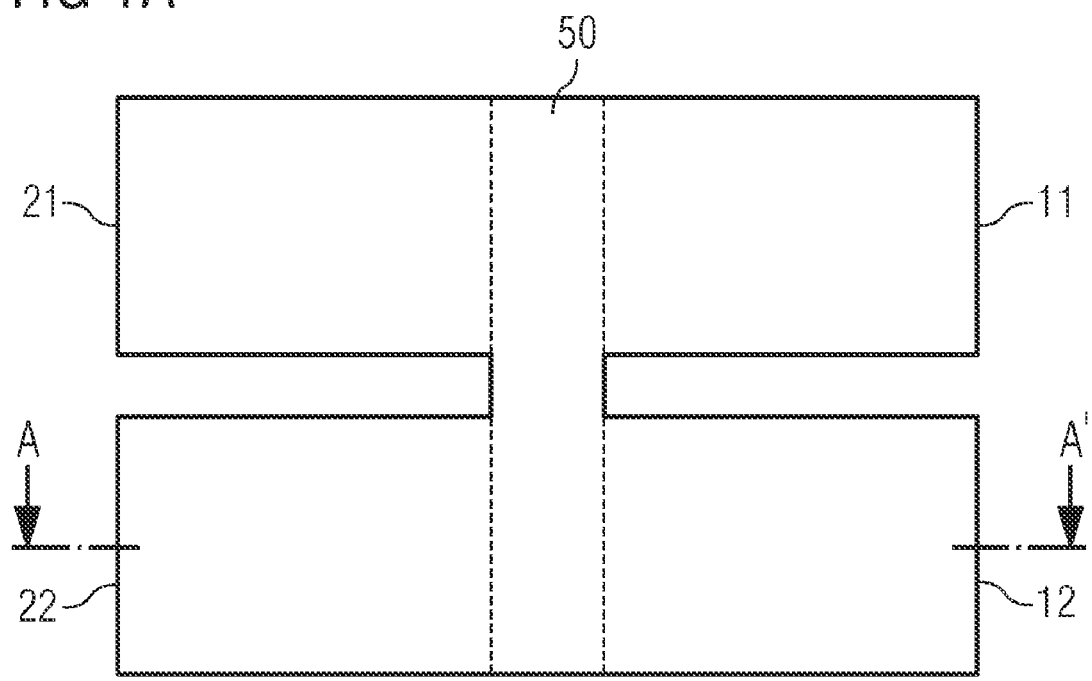
Figure 1A:
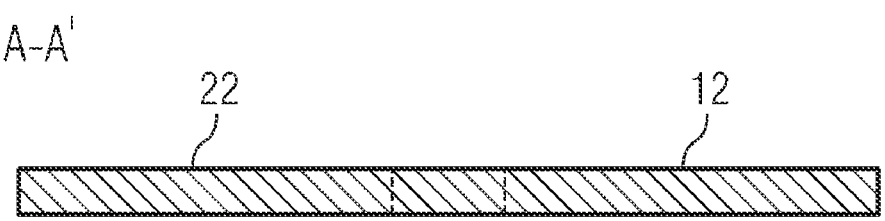

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include for example integrated electrical or electro-optical circuits. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on carriers or plates. Furthermore, carriers or plates may be placed on the semiconductor chips. The carriers and plates may be of any shape, size or material. During the fabrication of the devices the carriers and plates may be connected to each other. The carriers and plates may also be made from one piece. The carriers and plates may be connected among each other by connection means with the purpose of separating some of the carriers and plates in the course of the fabrication. Separation of the carriers and plates may be carried out by mechanical sawing, a laser beam, cutting, stamping, milling, etching or any other appropriate method. The carriers and plates may be electrically conductive. They may be fabricated from metals or metal alloys, in one embodiment copper, copper alloys, iron nickel, aluminum, aluminum alloys, or other appropriate materials. The carriers and plates may be, for example, a leadframe or a part of a leadframe. Furthermore, the carriers and plates may be plated with an electrically conductive material, for example copper, silver, iron nickel or nickel phosphorus.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material, for example of a metal, such as copper, aluminum or gold, a metal alloy or an electrically conductive organic material. The external contact elements may be leads of a leadframe.

Surfaces of the devices, for example, surfaces which are used as external contact pads, may form an assembly plane. The assembly plane may serve to mount the device onto another component, such as a circuit board for example.

The devices may include a mold material covering at least parts of the components of the devices. The mold material may be any appropriate thermoplastic or thermosetting material. Various techniques may be employed to cover the components with the mold material, for example compression molding, injection molding, powder molding or liquid molding.

Figure 1C:
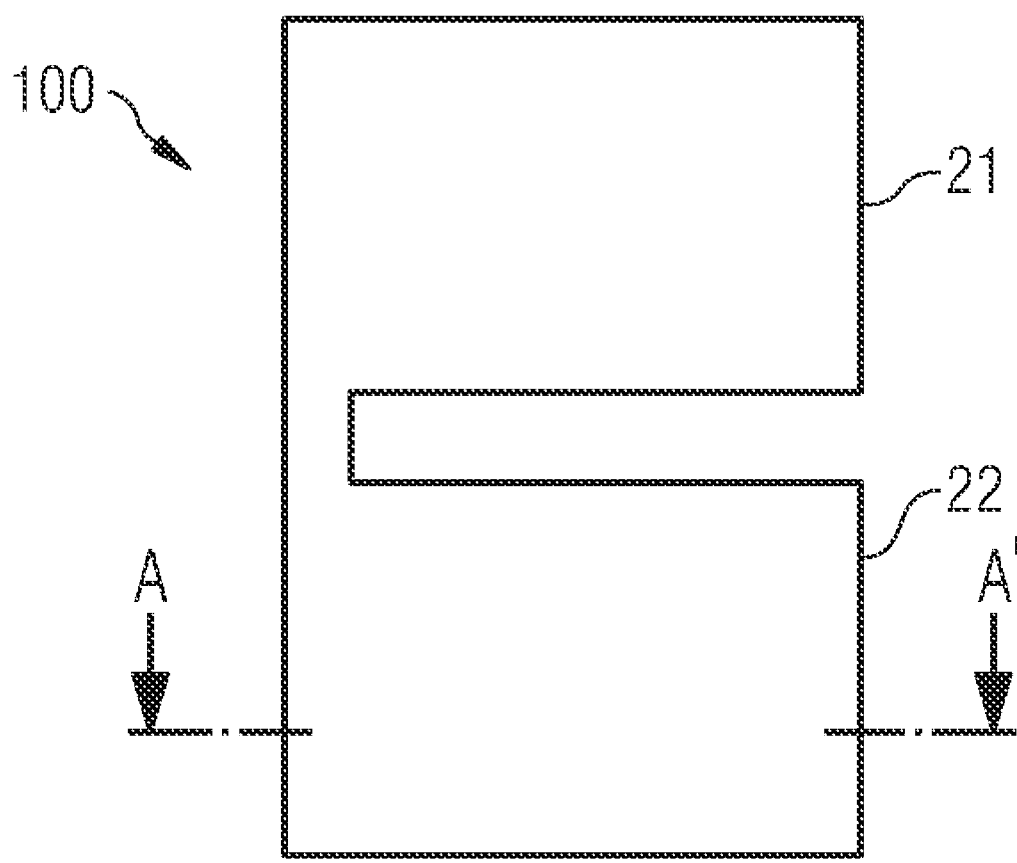
Figure 1C:
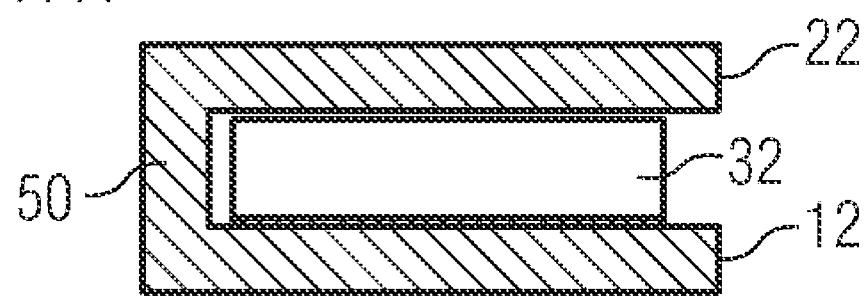

FIGS. 1A to 1C schematically illustrate a method for production of a device 100, which is illustrated in FIG. 1C. Each of the FIGS. 1A to 1C illustrates the components of device 100 in top view and in cross section along the line A-A' depicted in the top view perspective.

Firstly, an integral array of first carriers 11 and 12 as well as an integral array of second carriers 21 and 22 is provided (see FIG. 1A). Furthermore, the first carriers 11, 12 are connected to the second carriers 21, 22. The first carriers 11, 12 and/or the second carriers 21, 22 may be made in one piece. At least one connection element 50 may be provided connecting the integral array of first carriers 11, 12 to the integral array of second carriers 21, 22. First semiconductor chips 31 and 32 are arranged on the first carriers 11, 12 (see FIG. 1B). The integral array of second carriers 21, 22 is arranged over the first semiconductor chips 31, 32 (see FIG. 1C).

The device 100 illustrated in FIG. 1C includes a first carrier 11, a first semiconductor chip 31 arranged on the first carrier 11 and a second carrier 21 arranged over the first semiconductor chip 31. The first carrier 11 and the second carrier 21 are formed integrally.

Figure 2A:
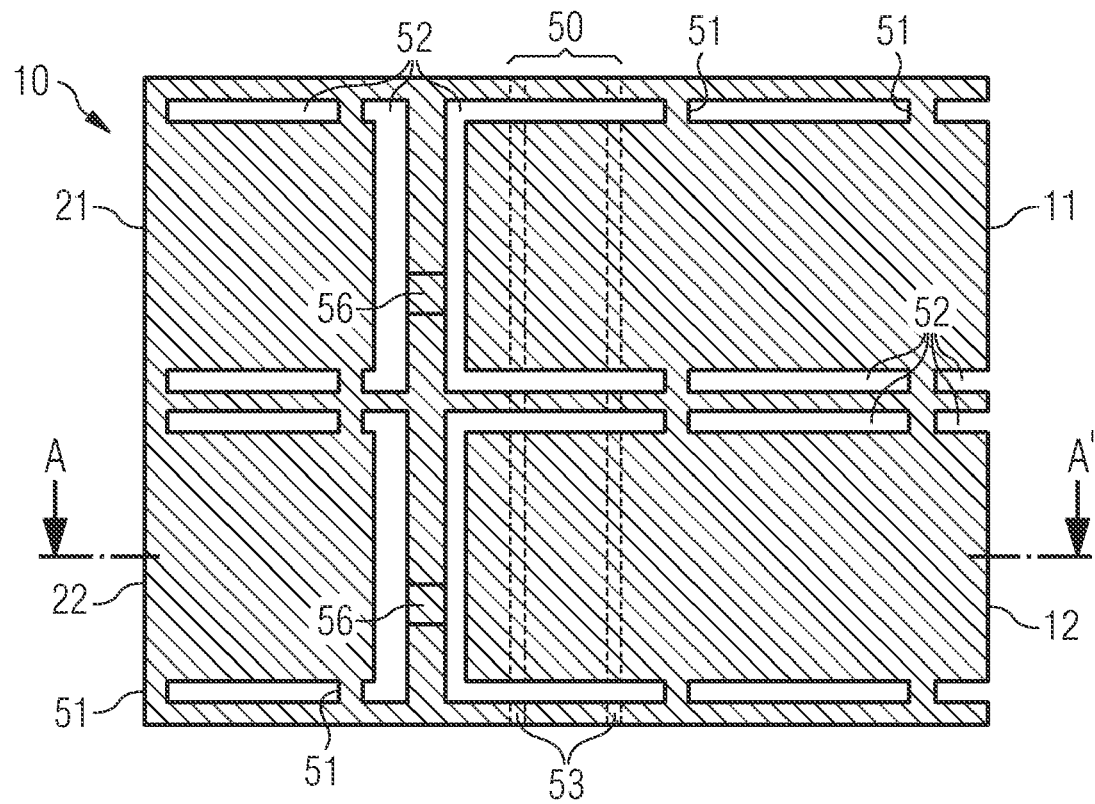
Figure 2A:
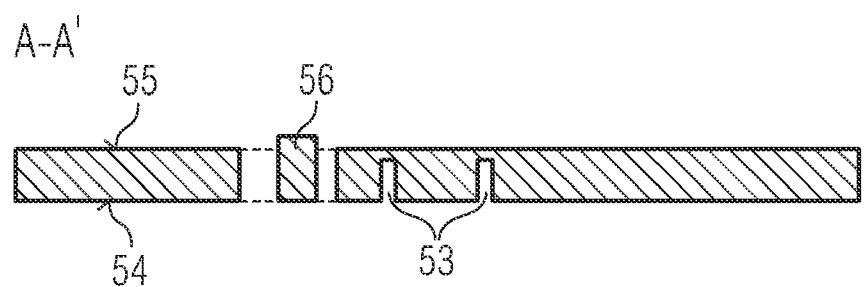
Figure 2C:
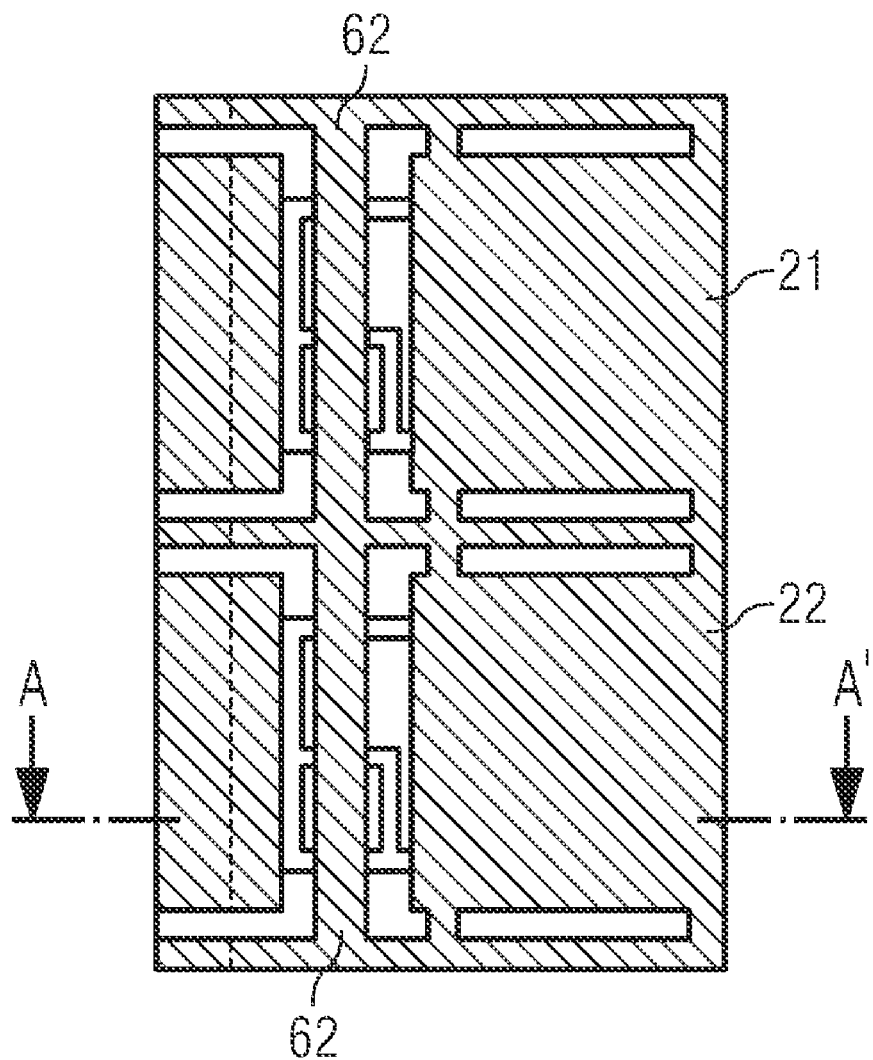
Figure 2C:
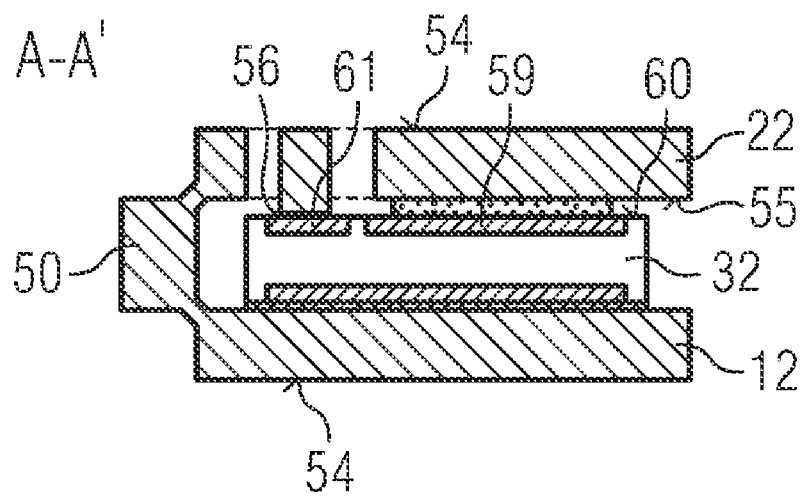
Figure 2D:
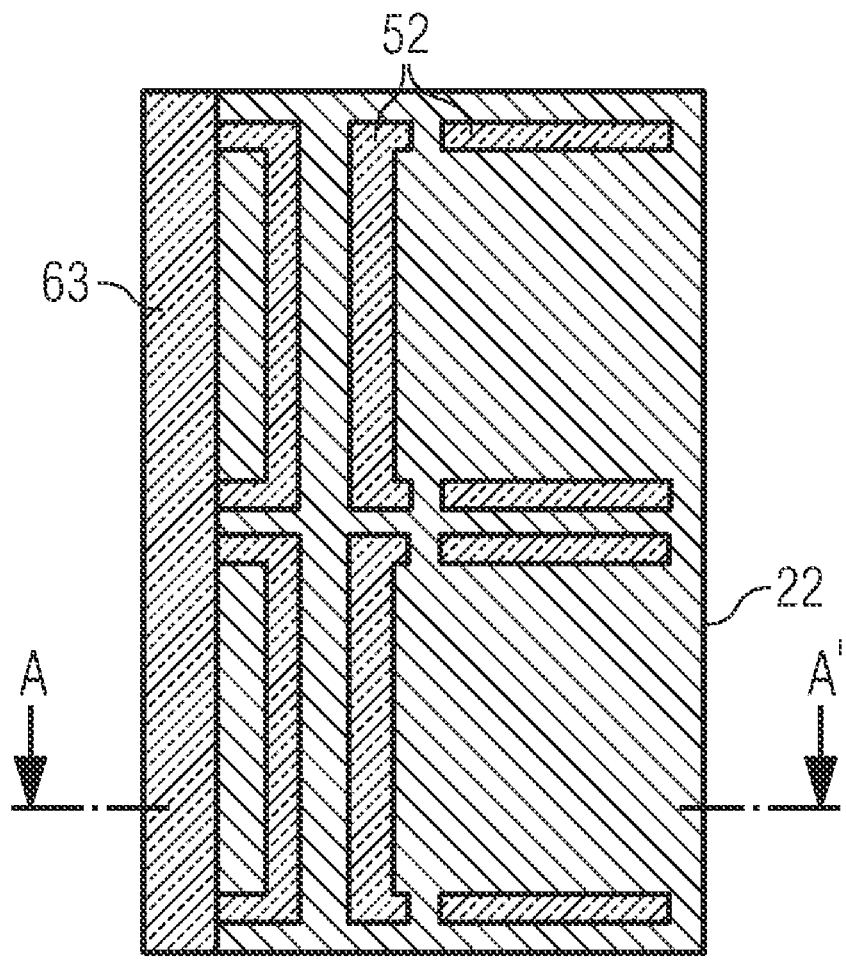
Figure 2D:
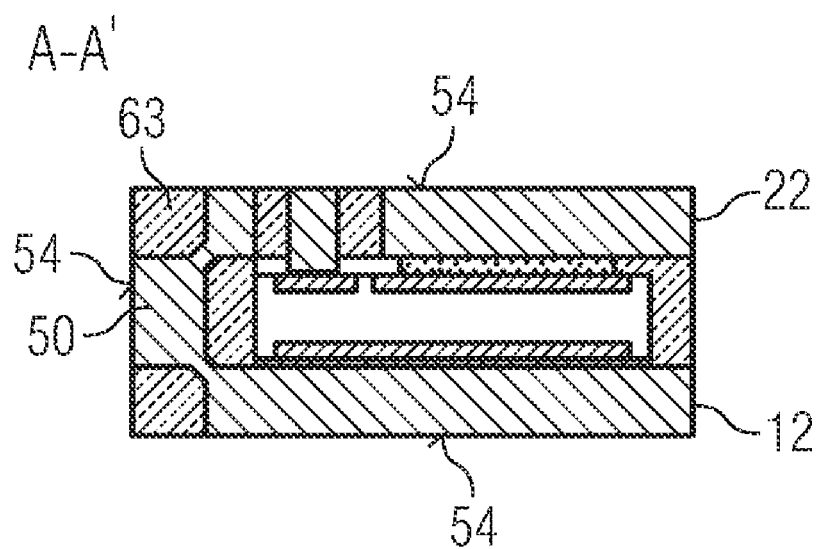
Figure 2E:
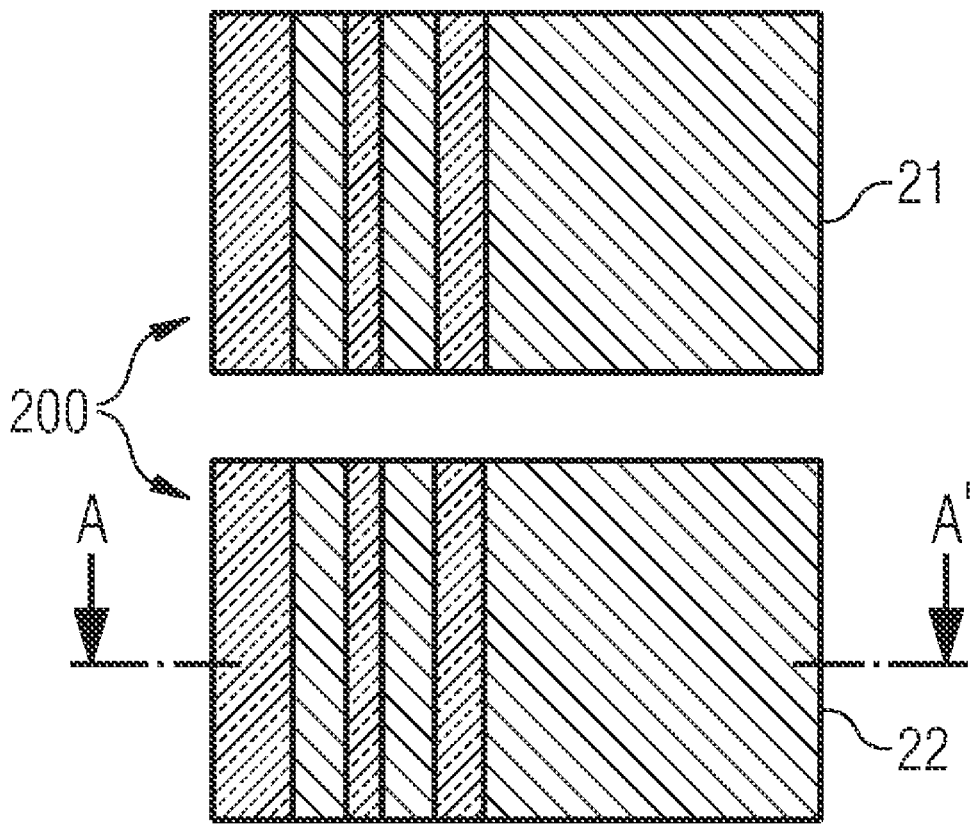
Figure 2E:
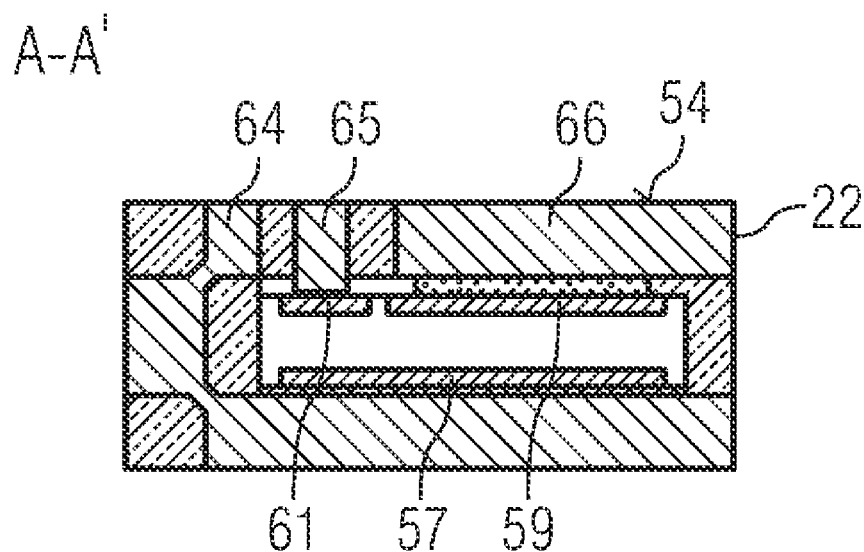
Figure 3A:
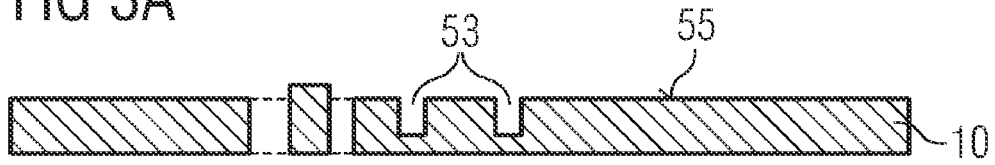
FIGS. 3A to 3D schematically illustrate variations of the method illustrated in FIGS. 2A to 2E.
Figure 3B:
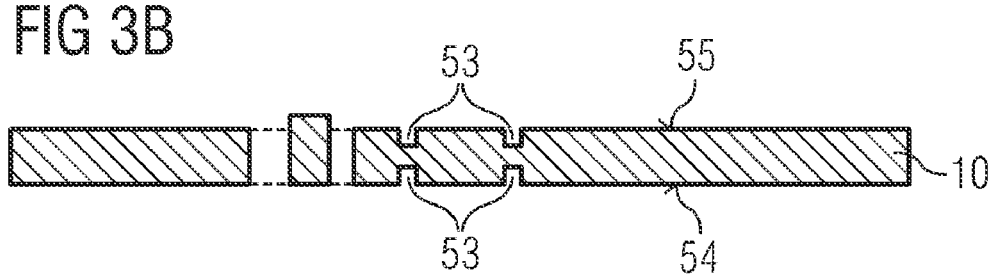
Figure 3C:
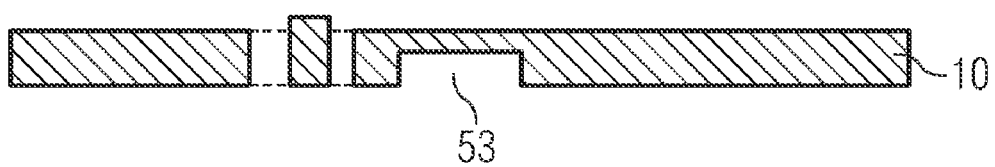
Figure 3D:
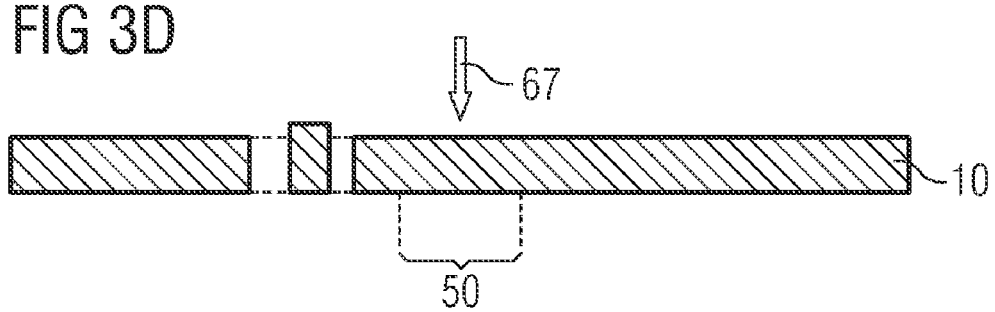
Figure 3D:
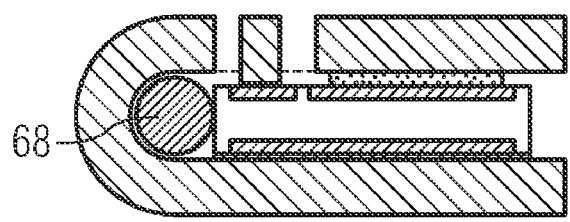

FIGS. 2A to 2E schematically illustrate a method for production of a device 200, which is illustrated in FIG. 2E. Each of the FIGS. 2A to 2E illustrates the components of device 200 in top view and in cross section along the line A-A' depicted in the top view perspective. The method illustrated in FIGS. 2A to 2E is an implementation of the method illustrated in FIGS. 1A to 1C. The features of the method described in the following can therefore be likewise applied to the method of FIGS. 1A to 1C. Moreover the features of the device 200 can be likewise applied to the device 100.

As illustrated in FIG. 2A, an integral array of first carriers 11, 12 and an integral array of second carriers 21, 22 is provided. In the embodiment illustrated in FIG. 2A, only two first carriers 11, 12 and two second carriers 21, 22 are illustrated. It may, however, be provided that each of the integral arrays of first and second carriers includes more than two carriers. The first carriers 11, 12 may be connected to the second carriers 21, 22 by the connection element 50. The first carriers 11, 12 as well as the second carriers 21, 22 may be connected to each other by dams (tie bars) 51. The integral array of first carriers 11, 12, the connection element 50 and the integral array of second carriers 21, 22 may be made in one piece. They may be electrically conductive and may, for example, be made from a metal, such as copper, or a metal alloy, such as iron nickel.

The first carriers 11, 12 and/or the second carriers 21, 22 may have a thickness in the range between 50 µm and 2 mm. If the carriers 11 to 22 are fabricated from a metal or a metal alloy, they may have been plated with a layer of a Ni—NiP alloy, a Ni—NiP—Au alloy, a NiPd alloy, Au, Ag, Sn or any other appropriate material. This layer may be deposited galvanically on the carriers 11 to 22 and may have a thickness of up to 100 µm. Furthermore, the aforementioned materials may be selectively deposited on different areas of the carriers 11 to 22. The layer plated onto the carriers 11 to 22 may serve as solder connection later on and may prevent corrosion of the carriers 11 to 22.

In order to form the outer shape of the integral arrays of first and second carriers 11 to 22 as for example illustrated in FIG. 2A, a plate 10 may be stamped, pressed, punched, cut, etched or treated by any other appropriate method, thereby producing cut-outs (or through-holes) 52 as illustrated in FIG. 2A. The plate 10 may be a leadframe or part of a leadframe, for example made of copper or an iron-nickel alloy. The first carriers 11, 12 may form a first section of the plate 10, and the second carriers 21, 22 may form a second section of the plate 10.

The connection element 50 connecting the integral array of first carriers 11, 12 to the integral array of second carriers 21, 22 may have one or two or more depressions 53 as illustrated in the cross section of the leadframe 10. In the top view perspective the depressions 53 are indicated by dashed lines. The depressions 53 may be arranged on a first surface 54 of the leadframe 10. The depressions 53 may be fabricated by stamping, embossing, punching, pressing, cutting, milling, etching, laser ablating or any other appropriate method. The depressions 53 may be arranged in lines as illustrated in FIG. 2A. In other embodiments, they may have any other geometry.

The widths of the depressions 53 may be in the range between 10 and 1000 µm, in one embodiment in the range between 100 and 200 µm. Special embodiments of the depressions 53 will be discussed below. The depths of the depressions 53 may be in the range between 10% and 90% of the thickness of the leadframe 10.

The first surface 54 of the leadframe 10 and a second surface 55 of the leadframe 10 opposite to the first surface 54 may be substantially planar. The leadframe 10 may include elements 56 protruding from the second surface 55 of the leadframe 10.

As illustrated in FIG. 2B, the first semiconductor chips 31, 32 are placed over the first carriers 11, 12, respectively. Further semiconductor chips may be placed over further first carriers (not illustrated in FIG. 2B). The first semiconductor chips 31, 32 as well as all other semiconductor chips described herein may have been fabricated on a wafer made of semiconductor material. After dicing the wafer and thereby separating the individual first semiconductor chips 31, 32, the first semiconductor chips 31, 32 are relocated on the first carriers 11, 12 in larger spacings as they have been in the wafer bond. The first semiconductor chips 31, 32 may have been manufactured on the same wafer, but may in one embodiment, have been manufactured on different wafers. Furthermore, the first semiconductor chips 31, 32 may be physically identical, but may also contain different integrated circuits.

Each of the first semiconductor chips 31, 32 may have a first electrode 57 on a first main surface 58 and a second electrode 59 on a second main surface 60 that is opposite to the first main surface 58. The first semiconductor chips 31, 32 may, for example, be vertical power diodes or vertical power transistors, for example IGBTs, JFETs, power bipolar transistors or power MOSFETs. In the latter case, which is exemplarily illustrated in FIG. 2B, the first and second electrodes 57 and 59 may be drain and source electrodes, respectively. Furthermore, each of the first semiconductor chips 31, 32 may have a third electrode 61 on the second main surface 60 functioning as a gate electrode in the case the first semiconductor chips 31, 32 being power MOSFETs. During operation of the device 200, voltages up to 1000 V may be applied between the drain electrode 57 and the source electrode 59. The switching frequency applied to the gate electrode 61 may be in the range from 100 kHz to 1 MHz, but may also be outside this range.

The first semiconductor chips 31, 32 are mounted onto the first carriers 11, 12 with their first main surfaces 58 facing the first carriers 11, 12, respectively.

The electrical connections between the drain electrodes 57 of the first semiconductor chips 31, 32 and the first carriers 11, 12 may, for example, be produced by diffusion soldering. For that, a solder material may be deposited on the first carriers 11, 12 or the drain electrodes 57 (not illustrated), for example by sputtering or other appropriate physical or chemical deposition methods. The solder material may have a thickness in the range from 100 nm to 10 μm, in one embodiment in the range from 1 to 3 μm. During the soldering operation, the solder material diffuses into the adjacent materials which leads to an intermetallic phase at the interface between the first semiconductor chips 31, 32 and the first carriers 11, 12. The solder material may, for example, consist of AuSn, AgSn, CuSn, Sn, AuIn, AgIn, AuSi or CuIn.

For producing the soldered joint, the first carriers 11, 12 may be heated by a hot plate to a temperature above the melting point of the solder material, for example in the range from 200 to 400° C., in one embodiment in the range from 330 to 350° C. In one embodiment, both the first carriers 11, 12 and the first semiconductor chips 31, 32 may be placed in an oven and heated to an appropriate temperature. A pick-and-place tool may be used capable of picking the first semiconductor chips 31, 32 and placing them on the heated first carriers 11, 12. During the soldering process the first semiconductor chips 31, 32 may be pressed onto the first carriers 11, 12 for an appropriate time in the range from 10 to 200 ms, in one embodiment around 50 ms.

Instead of a diffusion soldering process, other connection techniques may be used to attach the first semiconductor chips 31, 32 to the first carriers 11, 12, for example soft soldering or adhesive bonding using an electrically conductive adhesive. When using a soft soldering process to join the first semiconductor chips 31, 32 and the first carriers 11, 12 to each other, solder material remains at the interfaces between the first semiconductor chips 31, 32 and the first carriers 11, 12 after the soldering process has been finished. In case of adhesive bonding, an electrically conductive adhesive may be used, which may be based on filled or unfilled polyimides, epoxy resins, acrylate resins, silicone resins or mixtures thereof and may be enriched with gold, silver, nickel or copper in order to produce electrical conductivity.

As illustrated in FIG. 2C, the leadframe 10 may be bent along the depressions 53 such that the second carriers 21, 22 are rotated and placed over the second surfaces 60 of the first semiconductor chips 31, 32. The depressions 53 may function as film hinge joints allowing the folding of the leadframe 10. Moreover, after the folding of the leadframe 10, the first surfaces 54 of the first carriers 11, 12 and the first surfaces 54 of the second carriers 21, 22 may be arranged substantially plane-parallel. In the embodiment illustrated in FIG. 2C, the second carriers 21, 22 have been rotated about 180°, and the middle part of the connection element 50 has been rotated about 90°. The depressions 53 in the leadframe 10 facilitate this bending by increasing the mechanical flexibility of the leadframe 10 in these areas.

The source electrodes 59 and the gate electrodes 61 of the first semiconductor chips 31, 32 may be electrically connected to the second carriers 21, 22, respectively. These electrical connections may be produced by diffusion soldering, soft soldering, adhesive bonding using an electrically conductive adhesive or any other appropriate connection technique as described above in connection with FIG. 2B. If soldering or adhesive bonding is performed, the solder material or the adhesive may be deposited either on the second main surfaces 60 of the first semiconductor chips 31, 32 or on the second surfaces 55 of the second carriers 21, 22.

As can be seen from FIG. 2C, the gate electrodes 61 are coupled to bars 62 of the leadframe 10. The bars 62 contain the protruding elements 56. The protruding elements 56 are connected to the gate electrodes 61. The protruding elements 56 allow the bars 62 to overlap parts of the source electrodes 59 without short-circuiting the source electrodes 59 and the gate electrodes 61.

A mold material 63 may be used to cover at least parts of the first semiconductor chips 31, 32 and parts of other components of the devices 200 as illustrated in FIG. 2D. The first surfaces 54 of the first carriers 11, 12 and the second carriers 21, 22 may be left partly or completely uncovered by the mold material 63. Furthermore, the first surface 54 of the connection element 50 may be exposed from the mold material 63 so that the first surface 54 of the connection element 50 forms a side surface of the device 200 as illustrated in FIG. 2D. The mold material 63 may be applied such that the first surfaces 54 of the first carriers 11, 12 as well the first surfaces 54 of the second carriers 21, 22 form common planes with the mold material 63 as illustrated in FIG. 2D. Moreover, the first surface 54 of the connection element 50 and the mold material 63 may also form a common plane.

The first surfaces 54 or portions of them may be used as external contact elements to electrically couple the first semiconductor chips 31, 32 to external components. Furthermore, either the first surfaces 54 or portions of them may be used as an assembly plane to mount the device 200 to other components, such as circuit boards. Further components, such as heat sinks or cooling elements for example, may also be attached to one of the first surfaces 54.

The even and plane-parallel first surfaces 54 of the first carriers 11, 12 and the second carriers 21, 22 are helpful when the leadframe 10 is clamped into a mold cavity. Firstly, protrusions from the first surfaces 54 may damage the first semiconductor chips 31, 32 when clamped into the mold cavity. Secondly, deviations from plane-parallelism of the first surfaces 54 may cause the mold material 63 to unintentionally coat parts of the first surfaces 54.

The mold material 63 may be composed of any appropriate thermoplastic or thermosetting material, in one embodiment, it may be composed of material commonly used in contemporary semiconductor packaging technology. Various techniques may be employed to cover the components of the devices 200 with the mold material 63, for example compression molding, injection molding, powder molding or liquid molding.

The mold material 63 may contain a filling material consisting of small particles of glass ($SiO_2$), or other electrically insulating mineral filler materials like $Al_2O_3$, or organic filler materials. The mold material 63 may be injected through the cut-outs 52 of the leadframe 10. The grain size of the filler material may be in the range between 5 and 200 μm and in one embodiment in the range between 40 and 80 μm.

As illustrated in FIG. 2E the integral arrays of first carriers 11, 12 and second carriers 21, 22 as well as the mold material 63 may be separated, for example by employing mechanical sawing, a laser beam, etching, cutting, stamping or milling, in order to obtain the devices 200. In one embodiment, separation of the integral arrays of first carriers 11, 12 and second carriers 21, 22 may be carried out before the mold material 63 is applied to the devices 200.

The exposed first surfaces 54 of the second carriers 21, 22 may be used as external contact pads 64, 65 and 66 to electrically couple the device 200 to other components. The shapes and sizes of the external contact pads 64 to 66 may differ from the shapes and sizes illustrated in FIG. 2E. In the present embodiment, the external contact pads 64, 65 and 66 are electrically coupled to the drain electrode 57, the gate electrode 61 and the source electrode 59 of the first semiconductor chips 31, 32, respectively.

It is obvious to a person skilled in the art that the devices 100 and 200 are only intended to be exemplary embodiments, and many variations are possible. For example, it may be provided that the devices 100 and/or 200 include more than the first semiconductor chips 31, 32. A second semiconductor chip may be included in each of the devices 100 and/or 200 and may, for example, be stacked on the first semiconductor chip 31, 32 or may be arranged next to the first semiconductor chip 31, 32. In the latter case, the first carrier 11, 12 and/or the second carrier 21, 22 may be structured such that the desired electrical connection between the first and second semiconductor chips is established. Furthermore, a third semiconductor chip may be mounted over the second carrier 21, 22 after folding the leadframe 10. The second and/or third semiconductor chips may, for example, be further power semiconductor chips or may include control circuits to control the first semiconductor chips 31, 32.

Variations of the depressions 53 in the leadframe 10 and the folding mechanism are also possible. Some of theses variations are illustrated in FIGS. 3A to 3D. In the embodiment illustrated in FIG. 3A the depressions 53 are formed in the second surface 55 of the leadframe 54. In the embodiment illustrated in FIG. 3B the depressions 53 are formed in the first and second surfaces 54 and 55 of the leadframe 10. In the embodiment illustrated in FIG. 3C only one depression 53 is formed in the first surface 54 of the leadframe 10, however this depression 53 has a larger width than the depressions 53 illustrated in FIGS. 3A and 3B. Of course, the depression 53 of FIG. 3C may in one embodiment, be formed in the second surface 55 of the leadframe 10.

Instead of forming depressions 53 in the leadframe 10, the mechanical flexibility of the material of the connection element 50 may be increased by other methods, for example by a heat treatment, in order to facilitate the folding of the leadframe 10 in the area of the connection element 50. Exemplarily, a laser beam 67 is used in FIG. 3D to heat the leadframe 10 in the area of the connection element 50. As illustrated in the lower drawing of FIG. 3D, the leadframe 10 may be bent around a rod 68. Afterwards the rod 68 may be removed. As a further alternative, it may be provided that the leadframe 10 is bent around the edges of the first semiconductor chips 31, 32.

Figure 4:
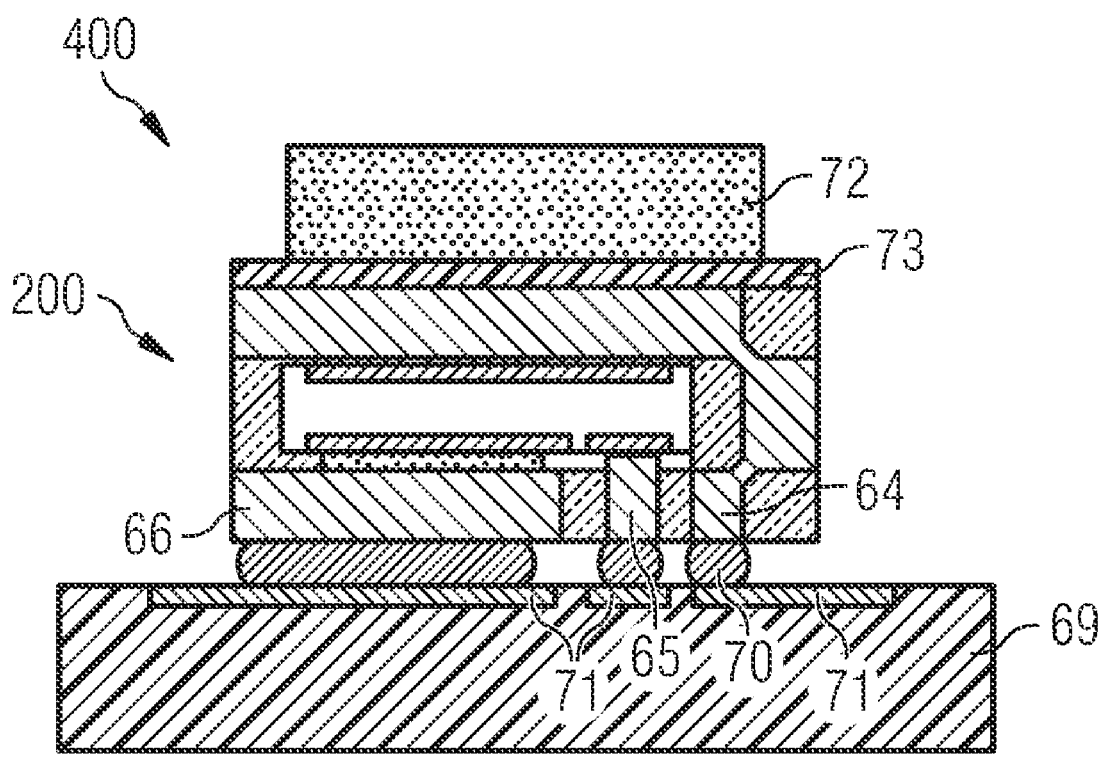
FIG. 4 schematically illustrates a device 400 as a further embodiment.

The external contact pads 64, 65 and 66 of the device 200 may be used to electrically couple the device 200 to other components. This is exemplarily illustrated in FIG. 4. There, an excerpt of a device 400 is schematically illustrated which includes the device 200 that is mounted onto a circuit board 69, for example a PCB (Printed Circuit Board), with the external contact pads 64 to 66 facing the circuit board 69. Solder deposits 70 may have been used to solder the external contact pads 64 to 66 to contact areas 71 of the circuit board 69.

On top of the device 200, a heat sink or cooling element 72 may be attached. Between the heat sink 72 and the device 200 an electrically insulating layer 73 may be arranged in order to electrically decouple the device 200 from the heat sink 72. During operation of the device 200, the heat sink 72 dissipates the heat generated by the first semiconductor chip 31.

Figure 5A:
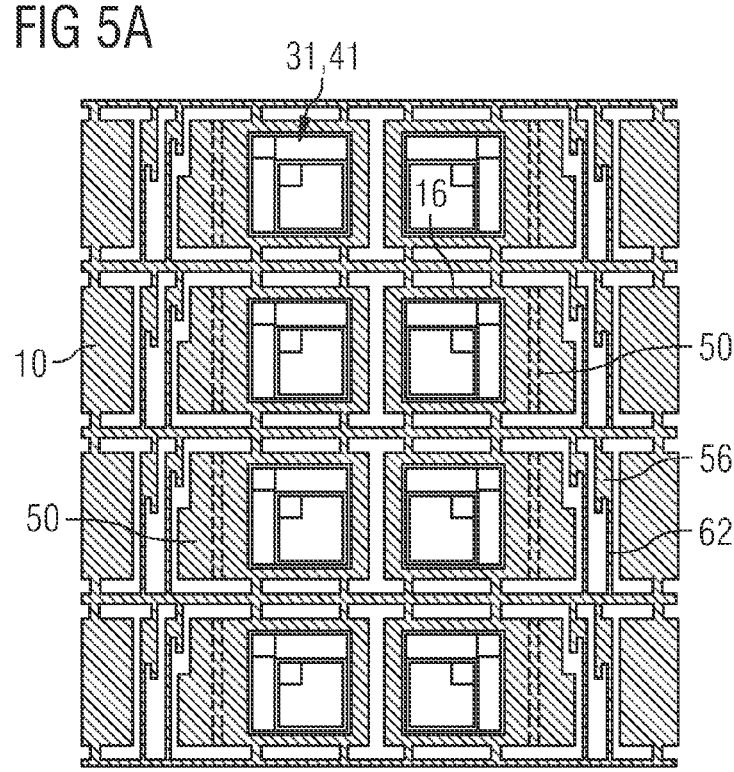
Figure 5B:
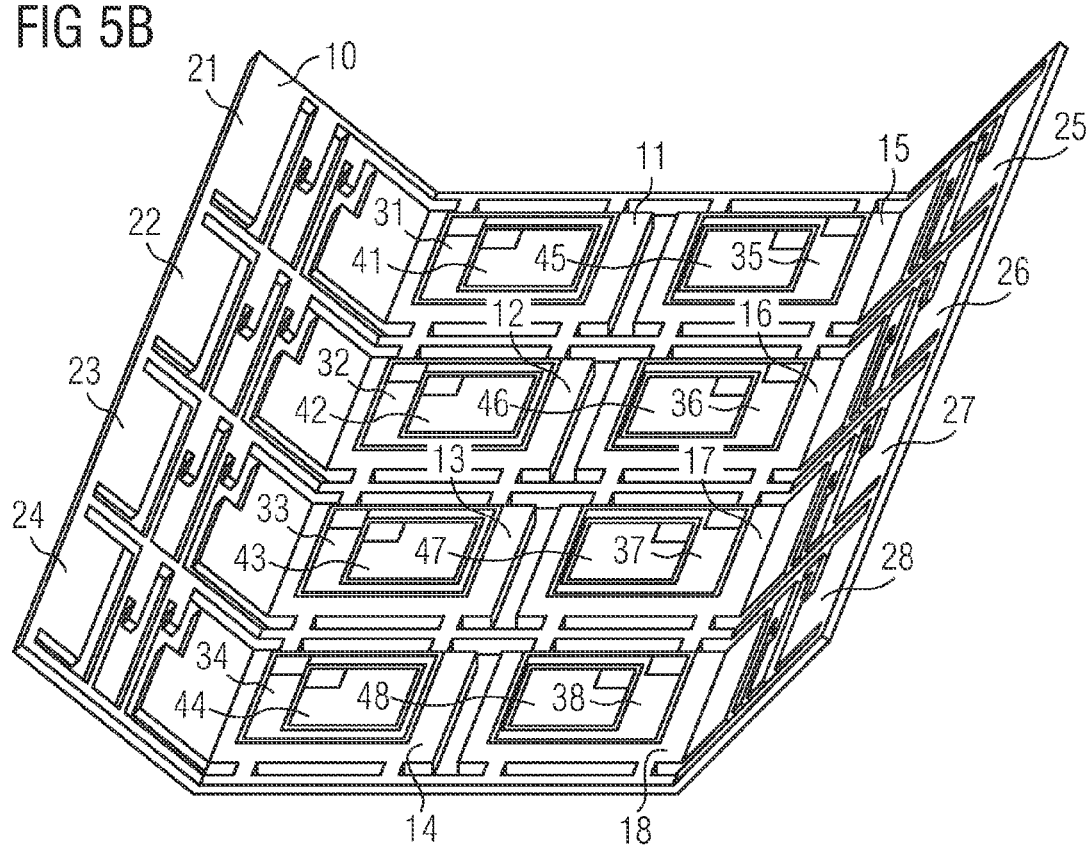
Figure 5E:
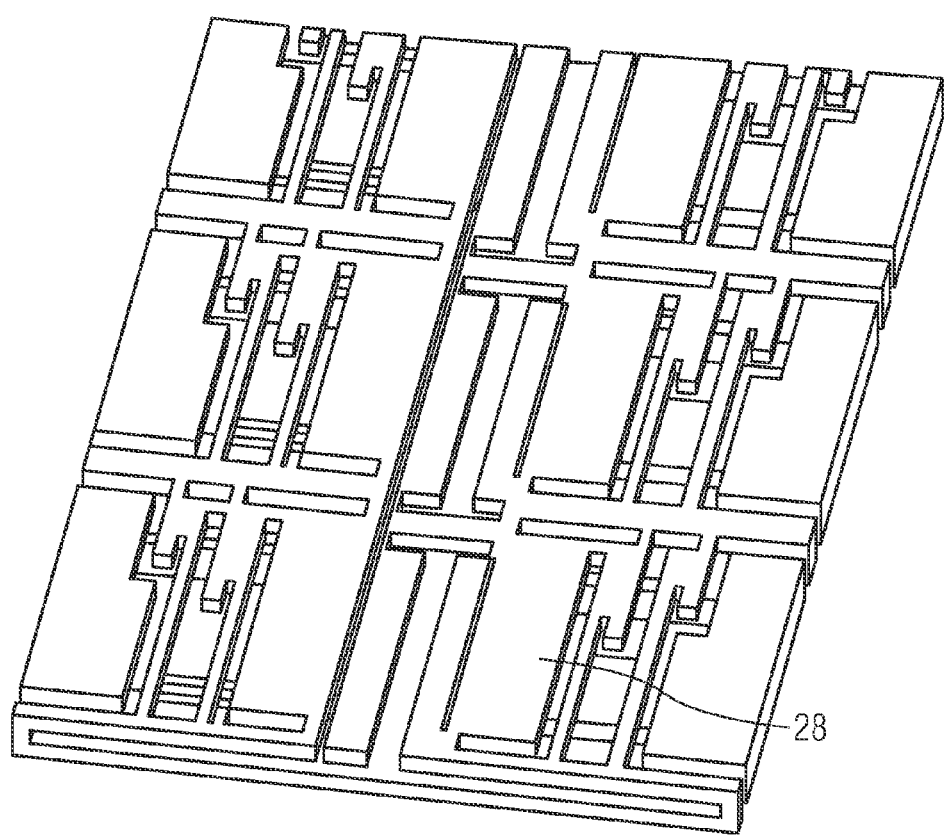
Figure 5F:
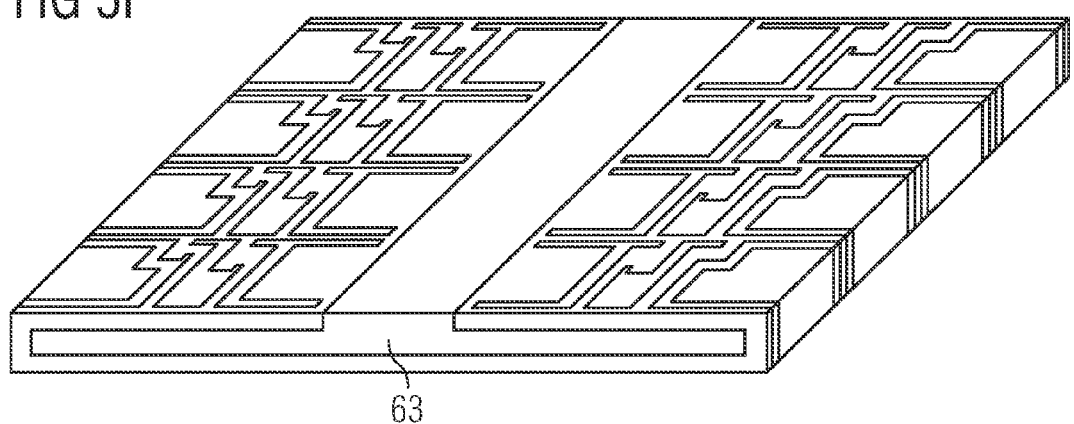
Figure 5G:
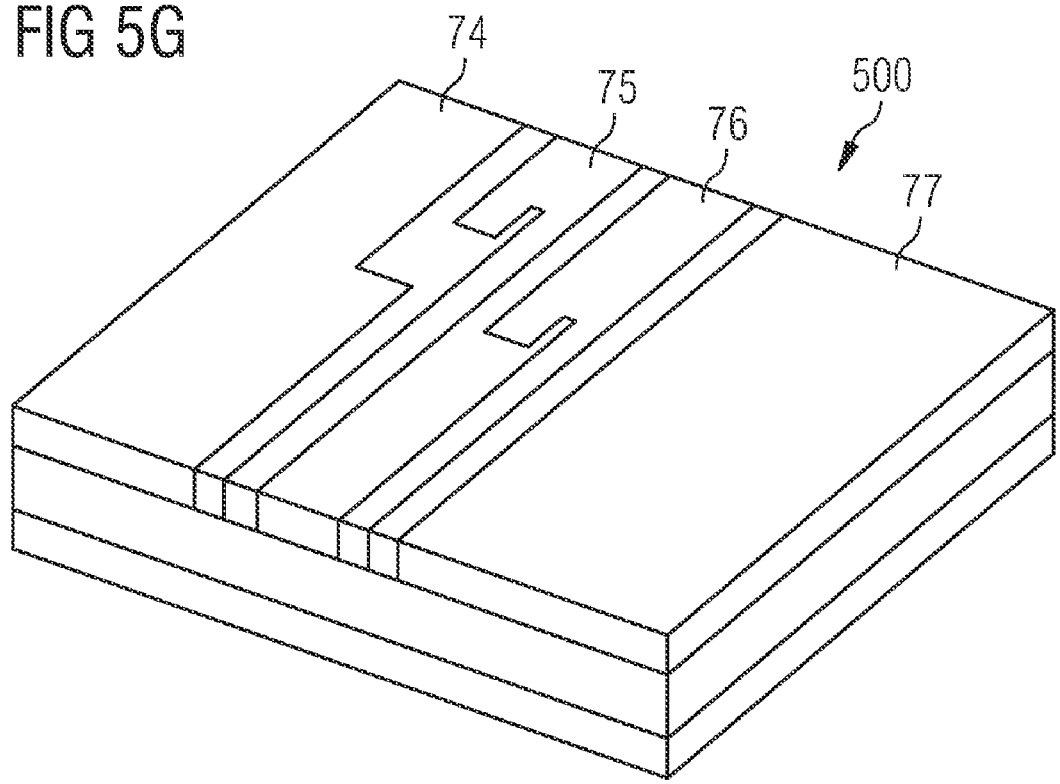

In FIGS. 5A to 5G the fabrication of a device 500, which is illustrated in FIG. 5G, is schematically illustrated as a further exemplary embodiment in a three-dimensional representation. The device 500 and the fabrication method thereof illustrate some similarities to the device 200 and the fabrication method thereof. Therefore similar or identical components used in both methods are denoted by the same reference numerals. Furthermore, in the following it is sometimes referred to the method of FIGS. 2A to 2E if the same method steps can be carried out as described above.

In FIGS. 5A, 5B and 5C a leadframe 10 is illustrated in a top view, a three-dimensional perspective and cross section, respectively. The leadframe 10 is made in one piece from a metal or a metal alloy and includes first carriers 11 to 18, second carriers 21 to 28 and connection elements 50. First semiconductor chips 31 to 38 are mounted on the first carriers 11 to 18. Second semiconductor chips 41 to 48 are mounted on the first semiconductor chips 31 to 38. Both the first semiconductor chips 31 to 38 and the second semiconductor chips 41 to 48 may be power semiconductor chips, for example power MOSFETs. In the latter case, the drain electrodes of the first semiconductor chips 31 to 38 may be electrically connected to the respective upper surfaces of the first carriers 11 to 18, and the drain electrodes of the second semiconductor chips 41 to 48 may be electrically connected to the respective source electrodes of the first semiconductor chips 31 to 38. These electrical connections may, for example, be established by soldering or adhesive bonding using an electrically conductive adhesive as described above in connection with FIG. 2B.

As illustrated in FIGS. 5B and 5C, the leadframe 10 may not be completely plane when provided. The first carriers 11 to 18 and the respective second carriers 21 to 28 may form an angle in the range between 60° and 150°. The connection elements 50 arranged between the first and second carriers 11 to 28 may be implemented as film hinge joints as described above in connection with FIGS. 2A and 3A to 3D.

Each of the second carriers 21 may include two bars 62, and each of the bars 62 may include an elements 56 which protrudes from the respective bar 62. The elements 56 may be used later on to contact the gate electrodes of the first and second semiconductor chips 31 to 48. Since the first semiconductor chips 31 to 38 are arranged below the second semiconductor chips 41 to 48, the elements 56 provided for the electrical connection of the first semiconductor chip 31 to 38 are larger than the elements 56 used for the electrical connection of the second semiconductor chips 41 to 48.

FIGS. 5D and 5E illustrate the folded leadframe 10 in a three-dimensional perspective. After the leadframe 10 has been bent along the film hinge joints 53 and the second carriers 21 to 28 have been rotated, the second carriers 21 to 28 are arranged over the respective second semiconductor chips 41 to 48. Parts of the second carriers 21 to 28 may be electrically connected to the gate electrode of the respective first semiconductor chip and the gate and source electrodes of the respective second semiconductor chips. These electrically connections may again be established by soldering or adhesive bonding using an electrically conductive adhesive as described above in connection with FIG. 2B.

As illustrated in FIG. 5F, a mold material 63 may be used to cover the first and second semiconductor chips 31 to 48 and parts of other components of the devices 500 as described in connection with FIG. 2D. The outer surfaces of the first carriers 11 to 18, the second carriers 21 to 28 and the connection elements 50 may be left uncovered. During operation of the devices 500, heat generated by the semiconductor chips included in the devices 500 may be dissipated by the exposed surfaces.

Finally, the leadframe 10 may be separated, for example by employing mechanical sawing, a laser beam, etching, cutting, stamping or milling, in order to obtain the devices 500. Each of the devices 500 may include a first and a second semiconductor chip. As illustrated in FIG. 5E, each of the devices 500 may have external contact pads 74 to 77. The external contact pads 74 and 75 may be electrically coupled to the drain electrode and the gate electrode of the first semiconductor chip, respectively. The external contact pads 76 and 77 may be electrically coupled to the gate electrode and the source electrode of the second semiconductor chip, respectively.

Figure 6:
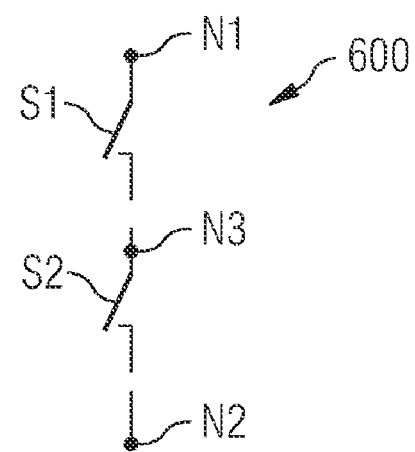
FIG. 6 illustrates a basic circuit of a half-bridge 600.

In the device 500 illustrated in FIG. 5G the source electrode of the first semiconductor chip is electrically connected to the drain electrode of the second semiconductor chip. Due to this connection, the device 500 can be used as a half-bridge. A basic circuit of a half-bridge 600 arranged between two knots N1 and N2 is illustrated in FIG. 6. The half-bridge 600 consists of two switches S1 and S2 connected in series. The first and second semiconductor chips of the device 500 may be implemented as the two switches S1 and S2, respectively. When compared to the device 500 illustrated in FIG. 5G, the node N1 is the drain electrode of the first semiconductor chip, the node N3 arranged between the two switches S1 and S2 is the drain electrode of the second semiconductor chip, and the node N2 is the source electrode of the second semiconductor chip.

The half-bridge 600 may, for example, be implemented in electronic circuits for converting DC voltages, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
providing an integral array of first carriers and an integral array of second carriers connected to the integral array of first carriers which are parts of a leadframe;
arranging first semiconductor chips on the integral array of first carriers; and
arranging the integral array of second carriers over the first semiconductor chips, wherein the first semiconductor chips have a first electrode on a first main surface and a second electrode on a second main surface.

2. The method of claim 1, comprising arranging the integral array of second carriers over the first semiconductor chips by rotating the integral array of second carriers with respect to the integral array of first carriers.

3. The method of claim 1, comprising arranging the integral array of second carriers over the first semiconductor chips by bending at least one connection element connecting the integral array of first carriers to the integral array of second carriers.

4. The method of claim 1, comprising wherein the integral array of first carriers has a first surface facing away from the first semiconductor chips and the integral array of second carriers has a second surface facing away from the first semiconductor chips after arranging the integral array of second carriers over the first semiconductor chips, wherein the first surface and the second surface are aligned plane-parallel to each other.

5. The method of claim 1, comprising covering the first semiconductor chips with a mold material.

6. The method of claim 5, comprising wherein the first surface of the integral array of first carriers and/or the second surface of the integral array of second carriers are left uncovered by the mold material.

7. The method of claim 5, wherein the first semiconductor chips are covered with the mold material after arranging the integral array of second carriers over the second main surfaces of the first semiconductor chips.

8. The method of claim 1, comprising separating the first semiconductor chips after arranging the integral array of second carriers over the first semiconductor chips.

9. The method of claim 8, wherein after the separating, the first and second carriers of each first semiconductor chip are no longer connected to each other.

10. The method of claim 1, comprising arranging second semiconductor chips on the first semiconductor chips before arranging the integral array of second carriers over the first semiconductor chips.

11. The method of claim 10, wherein each second carrier comprises at least one element protruding therefrom which is in electrical contact with an electrode of the corresponding first semiconductor chip after arranging the integral array of second carriers over the first semiconductor chips.

12. The method of claim 1, comprising arranging third semiconductor chips on the integral array of second carriers after arranging the integral array of second carriers over the first semiconductor chips.

13. The method of claim 1, comprising wherein the integral array of first carriers and the integral array of second carriers are electrically conductive.

14. The method of claim 1, wherein the first semiconductor chips are arranged with the first main surfaces facing the first carriers and with the second main surfaces facing and the second carriers, and with the first electrodes connected to the first carriers and the second electrodes connected to the second carriers.

15. The method of claim 1, wherein when arranging the integral array of second carriers over the first semiconductor chips, the first carriers are arranged in a plane defined by the second carriers.

16. The method of claim 1, wherein leadframe includes depressions which enable the leadframe to fold to enable the arranging of the integral array of second carriers over the first semiconductor chips.

17. A method, comprising:
providing a plate comprising cut-outs, the plate comprising a leadframe;
arranging first semiconductor chips on a first section of the plate, the first semiconductor chips having a first electrode on a first main surface and a second electrode on a second main surface; and
arranging a second section of the plate over the first semiconductor chips by bending the plate.

18. The method of claim 17, comprising covering the first semiconductor chips with a mold material.

19. The method of claim 18, comprising wherein a first surface of the first section and/or a second surface of the second section are left uncovered by the mold material.

20. The method of claim 17, comprising arranging second semiconductor chips on the first semiconductor chips before bending the plate.

21. The method of claim 17, comprising wherein at least one connection element connects the first section of the plate to the second section of the plate.

22. The method of claim 21, comprising wherein a thickness of the at least one connection element is at least partly smaller than a thickness of the first section of the plate.

23. The method of claim 21, comprising wherein a flexibility of the at least one connection element is higher than a flexibility of the first section of the plate.

24. The method of claim 17, comprising separating the first semiconductor chips after arranging the second section of the plate over the first semiconductor chips.

* * * * *